(12) United States Patent
Su et al.

(10) Patent No.: US 11,362,239 B2
(45) Date of Patent: Jun. 14, 2022

(54) MICRO DEVICE

(71) Applicant: PlayNitride Display Co., Ltd., MiaoLi County (TW)

(72) Inventors: Yi-Min Su, MiaoLi County (TW); Chih-Ling Wu, MiaoLi County (TW); Gwo-Jiun Sheu, MiaoLi County (TW); Sheng-Chieh Liang, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 160 days.

(21) Appl. No.: 16/528,668

(22) Filed: Aug. 1, 2019

(65) Prior Publication Data

US 2020/0357957 A1 Nov. 12, 2020

(30) Foreign Application Priority Data

May 7, 2019 (TW) .................................. 108115661

(51) Int. Cl.
*H01L 33/44* (2010.01)
*H01L 33/58* (2010.01)

(52) U.S. Cl.
CPC .............. *H01L 33/44* (2013.01); *H01L 33/58* (2013.01)

(58) Field of Classification Search
CPC ... H01L 33/44; H01L 33/52–60; H01L 33/46; H01L 33/465; H01L 33/54; H01L 33/56; H01L 33/58
See application file for complete search history.

(56) References Cited

U.S. PATENT DOCUMENTS

| 10,193,042 | B1* | 1/2019 | Tsai ........................ H01L 33/60 |
| 2014/0231850 | A1 | 8/2014 | Tischler et al. |
| 2017/0256674 | A1* | 9/2017 | Hashimoto ............. H01L 33/60 |
| 2018/0269364 | A1* | 9/2018 | Hoppel ................... H01L 33/52 |
| 2019/0305177 | A1* | 10/2019 | Takamatsu .............. H01L 25/50 |
| 2019/0326490 | A1* | 10/2019 | Haiberger ............... H01L 33/50 |

FOREIGN PATENT DOCUMENTS

| CN | 102986043 | 3/2013 |
| CN | 104183682 | 12/2014 |
| CN | 104576879 | 4/2015 |
| CN | 105810794 | 7/2016 |

(Continued)

OTHER PUBLICATIONS

"Office Action of Taiwan Counterpart Application," dated Sep. 23, 2019, p. 1-p. 6.

(Continued)

*Primary Examiner* — Latanya N Crawford Eason
(74) *Attorney, Agent, or Firm* — JCIPRNET

(57) ABSTRACT

A micro device includes an epitaxial structure, an insulating layer, and a light-transmissive layer. The epitaxial structure has a top surface and a bottom surface opposite to each other and a peripheral surface connected to the top surface and the bottom surface. The insulating layer covers the peripheral surface and the bottom surface of the epitaxial structure and exposes a portion of the peripheral surface. The light-transmissive layer covers the top surface of the epitaxial structure and is extended over at least a portion of the portion of the peripheral surface.

13 Claims, 10 Drawing Sheets

(56) References Cited

FOREIGN PATENT DOCUMENTS

| | | |
|---|---|---|
| CN | 106025040 | 10/2016 |
| CN | 109390437 | 2/2019 |
| TW | 201445784 | 12/2014 |
| TW | I548124 | 9/2016 |
| TW | 201810722 | 3/2018 |

OTHER PUBLICATIONS

Office Action of China Counterpart Application, dated Apr. 25, 2021, pp. 1-7.
"Office Action of China Counterpart Application", dated Sep. 15, 2021, p. 1-p. 7.

* cited by examiner

MICRO DEVICE

CROSS-REFERENCE TO RELATED APPLICATION

This application claims the priority benefit of Taiwan patent application serial no. 108115661, filed on May 7, 2019. The entirety of the above-mentioned patent application is hereby incorporated by reference herein and made a part of specification.

BACKGROUND OF THE INVENTION

Field of the Invention

The invention is related to a semiconductor device, and in particular to a micro device.

Description of Related Art

In general, in order to increase the optical efficiency of a light-emitting diode, a light-transmissive layer is usually formed on the top surface of an epitaxial structure by a lithography process. Since the current light-emitting diode has been reduced to the micron level, i.e., the micro LED, and the process margin of forming the light-transmissive layer by the lithography process is too small, the area of the resulting light-transmissive layer is less than the area of the top surface of the epitaxial structure. That is, the light-transmissive layer is retracted by a distance from the edge of the top surface of the epitaxial structure. As a result, a portion of the light emitted by the light-emitting layer may not be transmitted to the outside via the light-transmissive layer, thereby affecting the optical efficiency of the micro LED.

SUMMARY OF THE INVENTION

The invention provides a micro device that has better optical efficiency.

A micro device of the invention includes an epitaxial structure, an insulating layer, and a light-transmissive layer. The epitaxial structure has a top surface and a bottom surface opposite to each other and a peripheral surface connected to the top surface and the bottom surface. The insulating layer covers the peripheral surface and the bottom surface of the epitaxial structure and exposes a portion of the peripheral surface. The light-transmissive layer covers the top surface of the epitaxial structure and is extended over at least a portion of the portion of the peripheral surface.

In an embodiment of the invention, the material of the insulating layer is the same as the material of the light-transmissive layer.

In an embodiment of the invention, a first thickness of the insulating layer on the peripheral surface is equal to a second thickness of the light-transmissive layer on the peripheral surface.

In an embodiment of the invention, a first thickness of the insulating layer on the peripheral surface is less than a second thickness of the light-transmissive layer on the peripheral surface.

In an embodiment of the invention, a ratio of the first thickness of the insulating layer to the second thickness of the light-transmissive layer is greater than or equal to 0.8.

In an embodiment of the invention, a first thickness of the insulating layer on the peripheral surface is greater than a second thickness of the light-transmissive layer on the peripheral surface.

In an embodiment of the invention, a ratio of the first thickness of the insulating layer to the second thickness of the light-transmissive layer is less than 8.

In an embodiment of the invention, the light-transmissive layer completely covers the portion of the peripheral surface and is connected to the insulating layer.

In an embodiment of the invention, there is a vertical spacing between the insulating layer and the light-transmissive layer and the vertical spacing is less than or equal to 0.5 μm.

In an embodiment of the invention, a ratio of a first vertical height of the light-transmissive layer from the top surface to the peripheral surface to a second vertical height of the epitaxial structure is greater than or equal to 0.05 and less than or equal to 0.25.

In an embodiment of the invention, the first vertical height is greater than or equal to 0.5 μm and less than or equal to 1 μm.

In an embodiment of the invention, the root mean square roughness of a contact surface of the light-transmissive layer and the top surface of the epitaxial structure is greater than a light-emitting surface of the light-transmissive layer.

In an embodiment of the invention, the micro device further includes a light guide layer. The light guide layer is disposed on a portion of the light-transmissive layer, wherein the light-transmissive layer is located between the light guide layer and the top surface of the epitaxial structure.

In an embodiment of the invention, a ratio of an area of an orthographic projection of the light guide layer on the top surface to an area of an orthographic projection of the light-transmissive layer on the top surface is greater than or equal to 0.8 and less than or equal to 1.

In an embodiment of the invention, a width of an orthographic projection of the light guide layer on a plane is greater than a width of an orthographic projection of the epitaxial structure on the plane.

In an embodiment of the invention, the orthographic projection of the light guide layer on the plane covers the orthographic projection of the epitaxial structure on the plane.

Based on the above, in the design of the micro device of the invention, the light-transmissive layer covers the top surface of the epitaxial structure and is extended over at least a portion of the peripheral surface exposed by the insulating layer. That is, the area of the light-transmissive layer is greater than the area of the top surface of the epitaxial structure. The micro device of the invention may have better optical efficiency compared to the prior art in which the area of the light-transmissive layer is less than the area of the top surface of the epitaxial structure.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

An embodiment of the invention describes the structure of a micro device (such as a micro LED). Although some embodiments of the invention are specific to describing a micro LED including a p-n diode, it should be understood that the embodiments of the invention are not limited thereto, and certain embodiments may also be applied to other micro LEDs, and such micro LEDs are designed in such a way as to control the execution of predetermined electronic functions (e.g., diodes, transistors, integrated circuits) or photonic functions (LEDs, lasers).

Figure 1A:
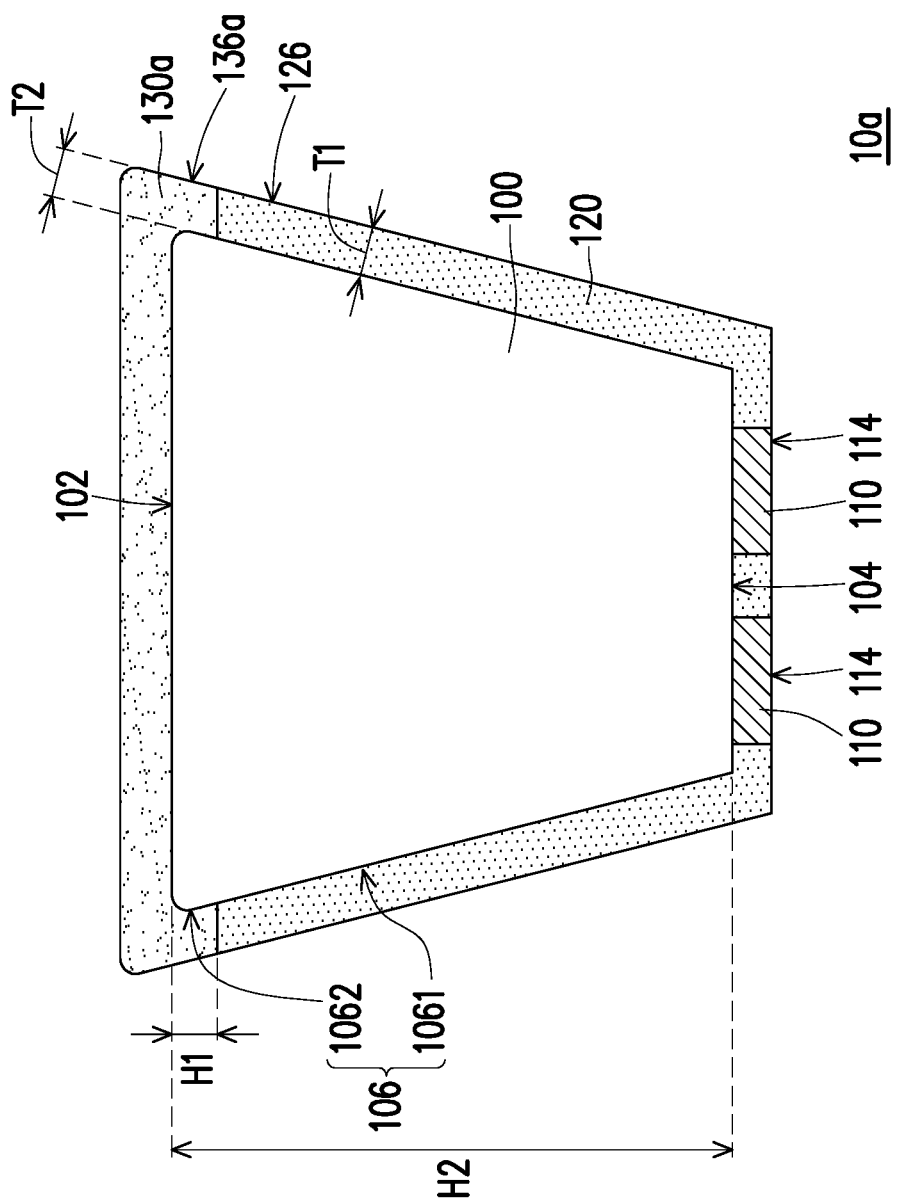
FIG. 1A is a cross section of a micro device of an embodiment of the invention.
Figure 1B:
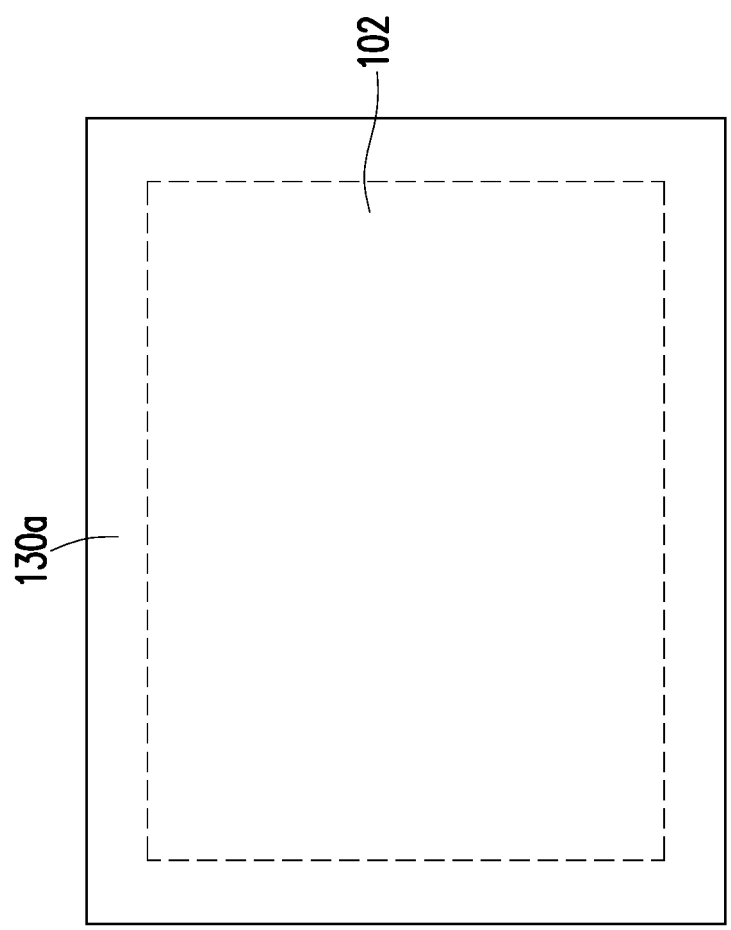
FIG. 1B is a top view of the micro device of FIG. 1A.

FIG. 1A is a cross section of a micro device of an embodiment of the invention. FIG. 1B is a top view of the micro device of FIG. 1A. Referring first to FIG. 1A, a micro device 10a of the present embodiment includes an epitaxial structure 100, two electrodes 110, an insulating layer 120, and a light-transmissive layer 130a. The epitaxial structure 100 has a top surface 102 and a bottom surface 104 opposite to each other and a peripheral surface 106 connected to the top surface 102 and the bottom surface 104. The electrodes 110 are disposed on the bottom surface 104 of the epitaxial structure 100 separately from each other. Herein, a first-type semiconductor layer (not shown), a light-emitting layer (not shown), and a second-type semiconductor layer (not shown) are sequentially stacked from the top surface 102 of the epitaxial structure 100 toward the bottom surface 104 thereof to form the epitaxial structure 100, and the electrodes 110 include a first-type electrode (not shown) and a second-type electrode (not shown) that are electrically opposite and respectively electrically connected to the first-type semiconductor layer and the second-type semiconductor. That is to say, the micro device 10a of the present embodiment may be, for example, a flip-chip type micro LED, but is not limited thereto. As shown in FIG. 1A, the cross-sectional profile of the epitaxial structure 100 of the present embodiment is, for example, an inverted trapezoid. However, in other embodiments not shown, the cross-sectional profile of the epitaxial structure may also be rectangular or other suitable shapes, and is not limited here.

Referring to FIG. 1A and FIG. 1B simultaneously, the insulating layer 120 of the present embodiment covers the peripheral surface 106 and the bottom surface 104 of the epitaxial structure 100 and exposes a lower surface 114 of each of the electrodes 110 and a portion 1062 of the peripheral surface 106. That is, the insulating layer 120 exposes the portion 1062 of the peripheral surface 106. In particular, the light-transmissive layer 130a of the present embodiment covers the top surface 102 of the epitaxial structure 100 and is extended over the portion 1062 of the peripheral surface 106. That is, on the peripheral surface 106, the portion 1062 of the peripheral surface 106 not covered by the insulating layer 120 is covered by the light-transmissive layer 130, the insulating layer 120 and the light-transmissive layer 130a are not overlapped on the peripheral surface 106, and the light-transmissive layer 130a is connected to the insulating layer 120. That is, the peripheral surface 106 of the epitaxial structure 100 of the present embodiment is completely covered by the insulating layer 120 and the light-transmissive layer 130a. At this time, the light-transmissive layer 130a is conformed to the top surface 102 of the epitaxial structure 100 and the portion 1062 of the surrounding surface 106. As shown in FIG. 1A, the cross-sectional shape of the light-transmissive layer 130a is, for example, a lid shape such as a staple shape. The contact surface of the light-transmissive layer 130a and the top surface 102 of the epitaxial structure 100 is embodied as a plane, but is not limited thereto. Specifically, as shown in FIG. 1B, the light-transmissive layer 130a completely covers the top surface 102 of the epitaxial structure 100, and is even further extended to the portion 1062 of the peripheral surface 106, so that the positive light output of the micro device 10a may completely pass through the light-transmissive layer 130a and the portion 1062 of a portion of the peripheral surface 106 to achieve better optical efficiency, but is not limited thereto.

Furthermore, in the present embodiment, the material of the insulating layer 120 may be the same as the material of the light-transmissive layer 130a, such as silicon dioxide, silicon nitride, or other suitable materials. The refractive index of the insulating layer 120 is, for example, greater than 1 and less than the refractive index of the epitaxial structure 100. More specifically, the refractive index of the insulating layer 120 is less than the refractive index of the first-type semiconductor layer (not shown), thereby avoiding total reflection of light emission inside the epitaxial structure 100, and thus increasing the optical efficiency of the micro device 10a.

Referring again to FIG. 1A, a first thickness T1 of the dielectric layer 120 of the present embodiment on the peripheral surface 106 is equal to a second thickness T2 of the light-transmissive layer 130a on the peripheral surface 106. That is, the insulating layer 120 and the light-transmissive layer 130a have the same thickness on the peripheral surface 106, and a side surface 136a of the light-transmissive layer 130a and a side surface 126 of the insulating layer 120 are continuously inclined and parallel to the peripheral surface 106 of the epitaxial structure 100. Herein, the first thickness T1 refers to the shortest distance of the insulating layer 120 on the peripheral surface 106, and the second thickness T2 refers to the shortest distance of the light-transmissive layer 130a on the peripheral surface 106.

Furthermore, the light-transmissive layer 130a of the present embodiment has a first vertical height H1 from the top surface 102 to the peripheral surface 106, and the epitaxial structure 100 has a second vertical height H2. In a preferred embodiment, the ratio of the first vertical height H1 to the second vertical height H2 is greater than or equal to 0.05 and less than or equal to 0.25, so that the micro device 10a may have better optical efficiency and may also protect the peripheral surface 106. If the ratio of the first vertical height H1 to the second vertical height H2 is less than 0.05, it means that the proportion of the light-transmissive layer 130a on the peripheral surface 106 is smaller, which may result in poor optical efficiency of the micro device 10a; on the other hand, if the ratio of the first vertical height H1 to the second vertical height H2 is greater than 0.25, it means that the proportion of the insulating layer 120 on the peripheral surface 106 is smaller, which may result in insufficient protective effect of the peripheral surface 106. In another more preferred embodiment, the first vertical height H1 is greater than or equal to 0.5 μm and less than or equal to 1 μm, so that the micro device 10a may have better optical efficiency and may also protect the peripheral surface 106.

In short, in the design of the micro device 10a of the present embodiment, the light-transmissive layer 130a covers the top surface 102 of the epitaxial structure 100 and is extended over the portion 1062 of the peripheral surface 106 exposed by the insulating layer 120. That is, the area of the light-transmissive layer 130a is greater than the area of the top surface 102 of the epitaxial structure 100. The micro device 10a of the present embodiment may have better optical efficiency compared to the prior art in which the area of the light-transmissive layer is less than the area of the top surface of the epitaxial structure.

It should be mentioned here that, the following embodiments adopt the reference numerals of the embodiments above and a portion of the content thereof, wherein the same reference numerals are used to represent the same or similar devices and descriptions of the same technical content are omitted. The omitted portions are as described in the embodiments above and are not repeated in the embodiments below.

Figure 2A:
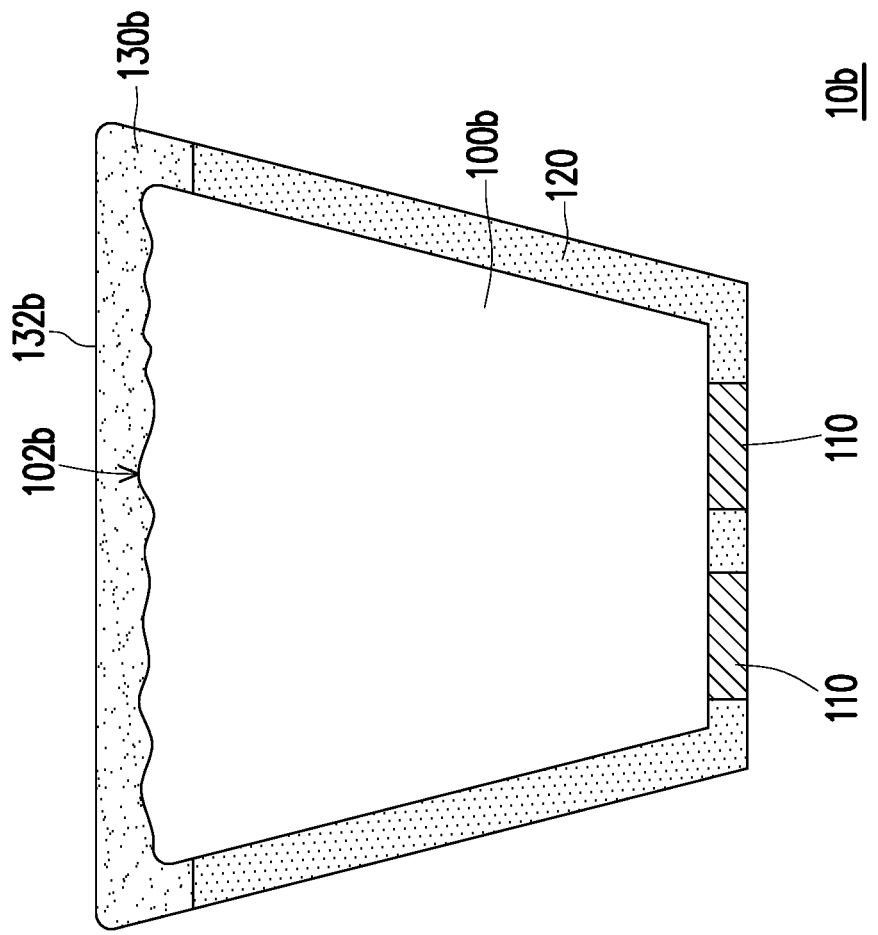
FIG. 2A is a cross section of a micro device of another embodiment of the invention.
Figure 2B:
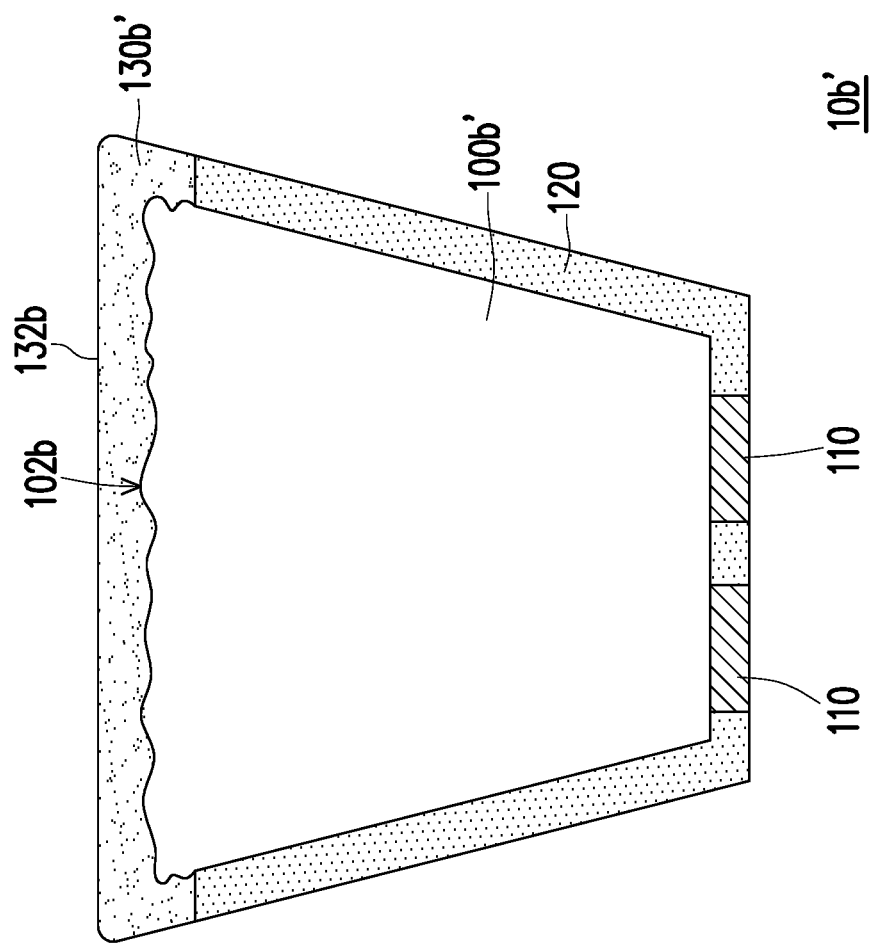
FIG. 2B is a cross section of a micro device of another embodiment of the invention.

FIG. 2A is a cross section of a micro device of another embodiment of the invention. Referring to FIG. 1A and FIG. 2A simultaneously, a micro device 10b of the present embodiment is similar to the micro device 10a, and the difference between the two is that in the present embodiment, the contact surface of a light-transmissive layer 130b of the micro device 10b and a top surface 102b of an epitaxial structure 100b is embodied as a roughened surface. That is, the contact surface of the light-transmissive layer 130b and the epitaxial structure 100b is greater than the root mean square roughness of a top surface 132b of the light-transmissive layer 130b. Herein, the top surface 132b of the light-transmissive layer 130b may be slightly flat and the contact surface is roughened, which may effectively increase the optical efficiency of the micro device 10b. Of course, in other embodiments not shown, the contact surface of the light-transmissive layer and the top surface of the epitaxial structure may also be a periodic or irregular patterned surface, and the top surface of the light-transmissive layer may also adopt a rough surface design to increase light emission, which is still within the scope of the invention. In particular, as shown in FIG. 2B, the contact surface of the light-transmissive layer 130b' of the micro device 10b' and the peripheral surface of the epitaxial structure 100b' may also be a roughened surface, which may increase light emission.

Figure 3:
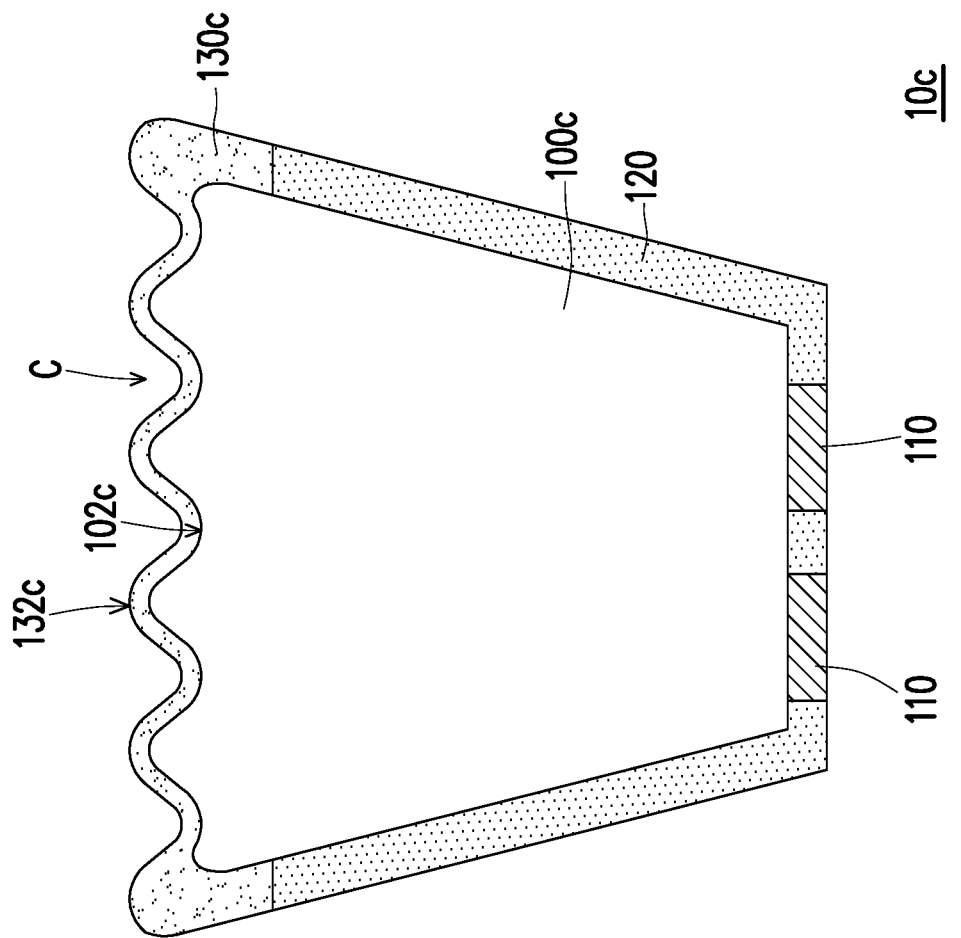
FIG. 3 is a cross section of a micro device of yet another embodiment of the invention.

FIG. 3 is a cross section of a micro device of yet another embodiment of the invention. Referring to FIG. 2A and FIG. 3 simultaneously, a micro device 10c of the present embodiment is similar to the micro device 10b, and the difference between the two is that in the present embodiment, a light-transmissive layer 130c of the micro device 10c is conformed to a top surface 102c of an epitaxial structure 100c, and the contact surface of the epitaxial structure 100c and the top surface 102c of the light-transmissive layer 130c is a patterned surface. That is, the light-transmissive layer 130c is also a patterned surface with respect to a top surface 132c of the epitaxial structure 100c. The top surface 132c of the light-transmissive layer 130c and the contact surface of the epitaxial structure 100c and the light-transmissive layer 130c are both patterned surfaces, which may effectively improve the optical efficiency of the micro device 10c. More specifically, the patterned surface has a groove C, wherein the width of the groove C may be greater than or equal to 10 nm and less than or equal to 2000 nm, and the depth of the groove C may be greater than or equal to 10 nm and less than or equal to 2000 nm. Via the nano-scale groove C, better optical efficiency may be achieved. Of course, in other embodiments not shown, the top surface of the light-transmissive layer and the contact surface of the light-transmissive layer and the top surface of the epitaxial structure or the contact surface with the peripheral surface of the epitaxial structure may also be irregular patterned surfaces or roughened surfaces, which still belong to scope of the invention.

Figure 4A:
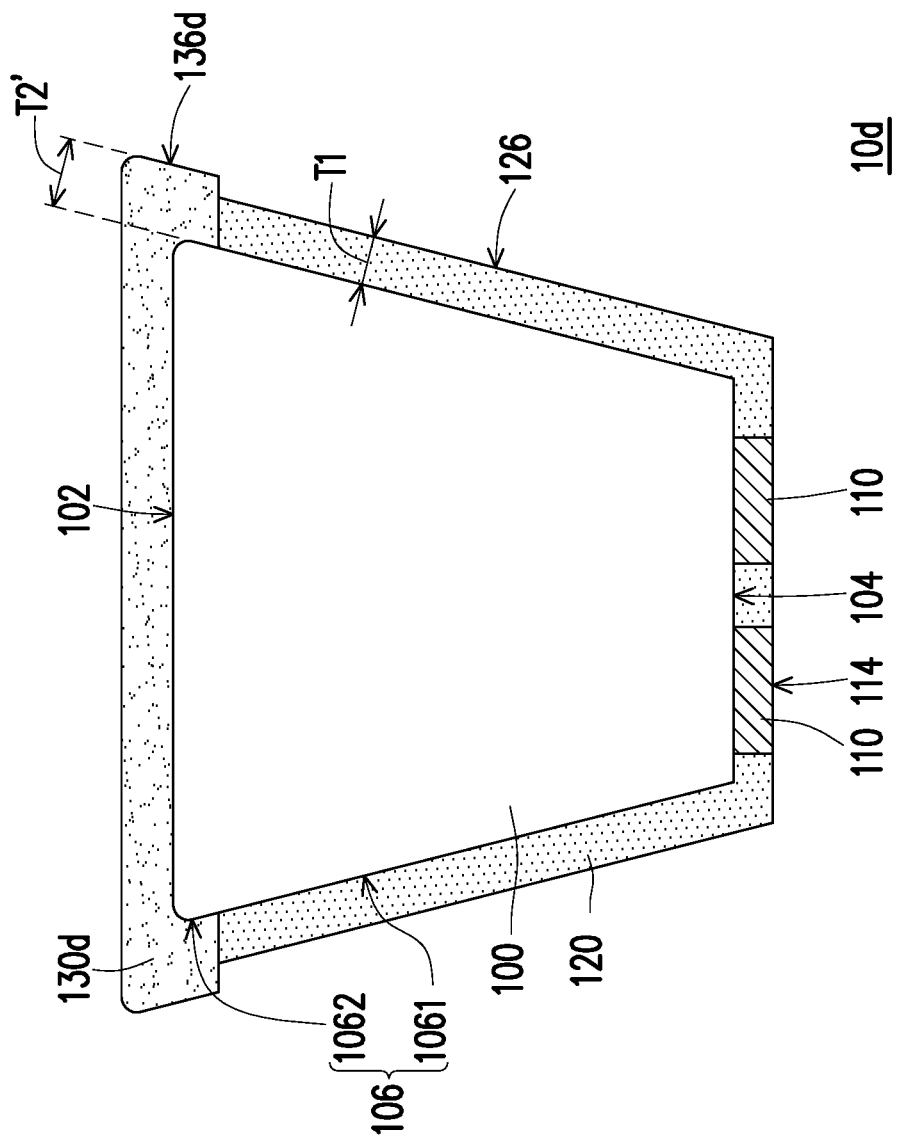
FIG. 4A is a cross section of a micro device of yet another embodiment of the invention.

FIG. 4A is a cross section of a micro device of yet another embodiment of the invention. Referring to FIG. 1A and FIG. 4A simultaneously, a micro device 10d of the present embodiment is similar to the micro device 10a, and the difference between the two is that in the present embodiment, the first thickness T1 of the insulating layer 120 of the micro device 10d on the peripheral surface 106 is less than a second thickness T2' of a light-transmissive layer 130d on the peripheral surface 106. That is, a side surface 136d of the light-transmissive layer 130d is protruded from the side surface 126 of the insulating layer 120, and this design may effectively improve the lateral light emission pattern of the micro device 10d. Herein, the ratio of the first thickness T1 of the insulating layer 120 to the second thickness T2' of the light-transmissive layer 130d is greater than or equal to 0.8 and less than 1. When the ratio of the first thickness T1 to the second thickness T2' is less than 0.8, the difference at the location where the insulating layer 120 and the light-transmissive layer 130d are in contact is too large, thus affecting the light emission pattern.

Figure 4B:
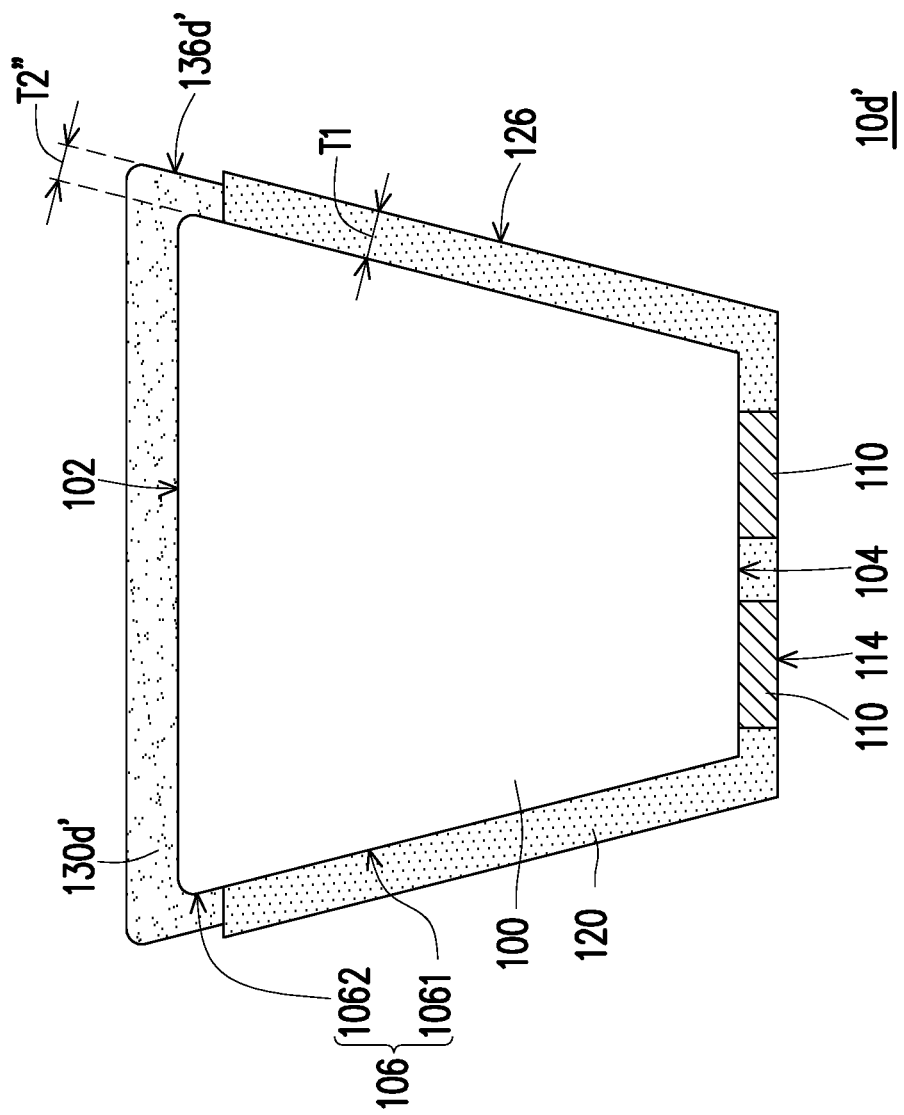
FIG. 4B is a cross section of a micro device of yet another embodiment of the invention.

FIG. 4B is a cross section of a micro device of yet another embodiment of the invention. Referring to FIG. 4A and FIG. 4B simultaneously, a micro device 10d' of the present embodiment is similar to the micro device 10d, and the difference between the two is that in the present embodiment, the first thickness T1 of the insulating layer 120 of the micro device 10d' on the peripheral surface 106 is greater than a second thickness T2" of a light-transmissive layer 130d' on the peripheral surface 106. That is, a side surface 136d' of the light-transmissive layer 130d' is not protruded from the side surface 126 of the insulating layer 120, and this design may effectively improve the lateral light emission efficiency of the micro device 10d'. Here, the ratio of the first thickness T1 of the insulating layer 120 to the second thickness T2" of the light-transmissive layer 130d is greater than 1 and less than or equal to 8. When the ratio of the first thickness T1 to the second thickness T2" is greater than 8, the difference at the location where the insulating layer 120 and the light-transmissive layer 130d' are in contact is too large, thus affecting the light emission efficiency.

Figure 5:
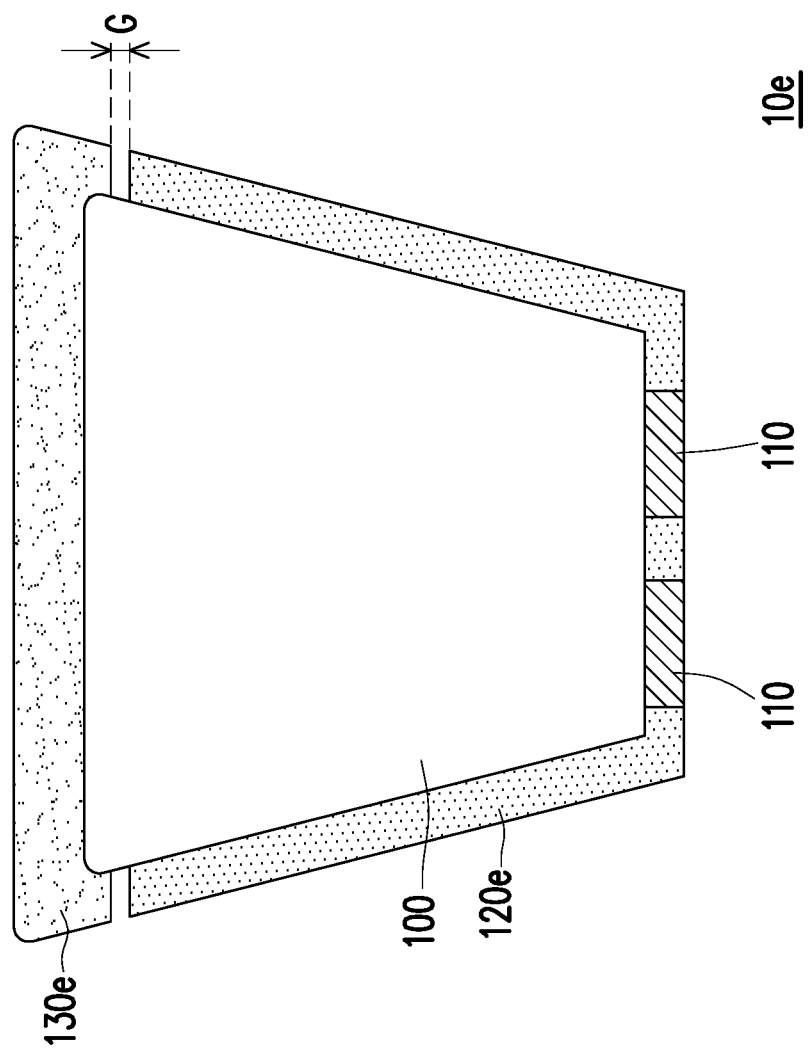
FIG. 5 is a cross section of a micro device of yet another embodiment of the invention.

FIG. 5 is a cross section of a micro device of yet another embodiment of the invention. Referring to FIG. 1A and FIG. 5 simultaneously, a micro device 10e of the present embodiment is similar to the micro device 10a, and the difference between the two is that in the micro device 10e of the present embodiment, there is a vertical spacing G between an insulating layer 120e and a light-transmissive layer 130e, and the vertical spacing G is less than or equal to 0.5 μm. In other words, in the present embodiment, the light-transmissive layer 130e is not connected to the insulating layer 120. This design may prevent damage to the insulating layer 120 if the light-transmissive layer 130e is damaged during subsequent transfer.

Figure 6A:
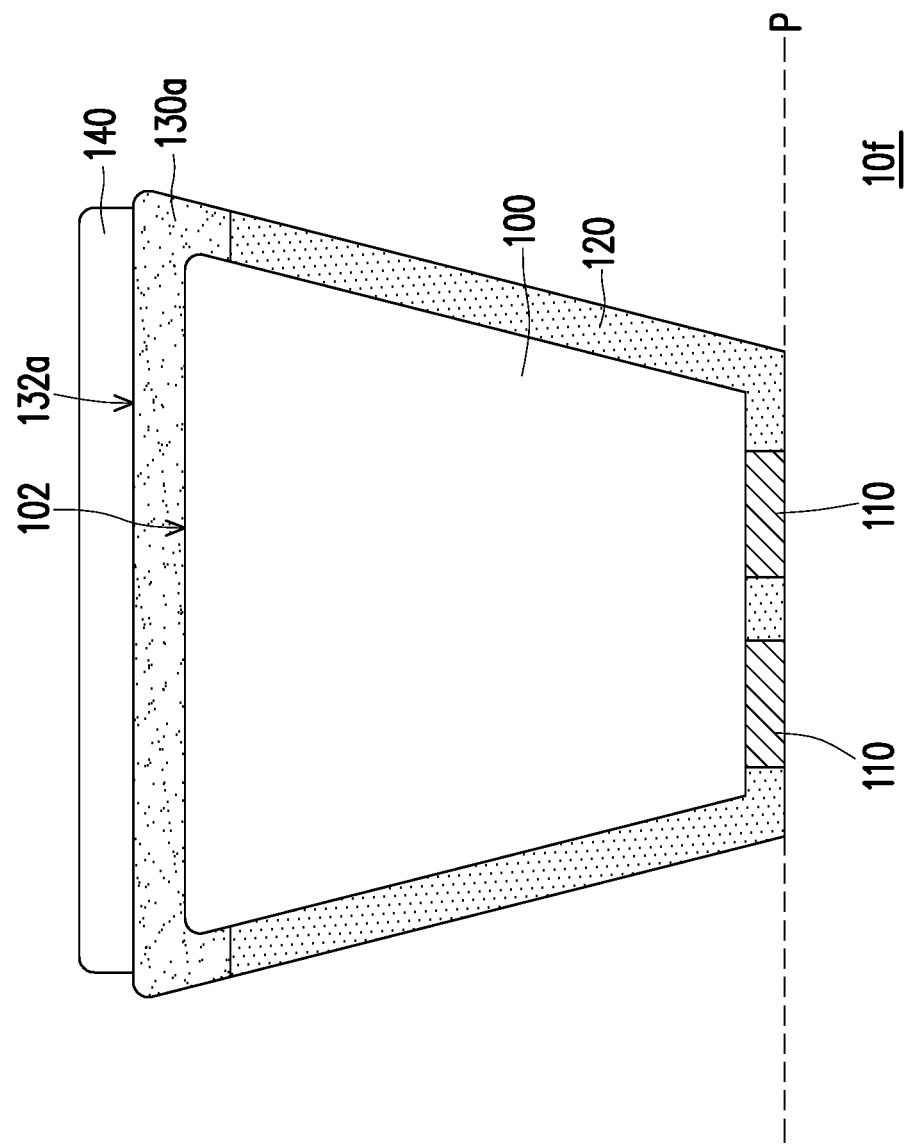
FIG. 6A is a cross section of a micro device of yet another embodiment of the invention.
Figure 6B:
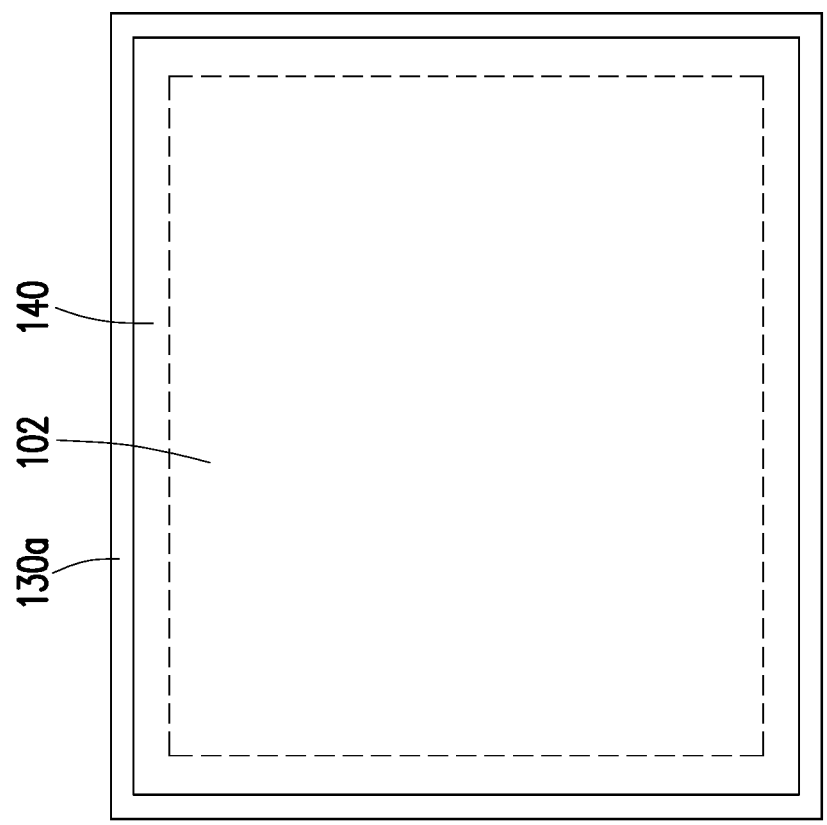
FIG. 6B is a top view of the micro device of FIG. 6A.

FIG. 6A is a cross section of a micro device of yet another embodiment of the invention. FIG. 6B is a top view of the micro device of FIG. 6A. Referring to FIG. 1A and FIG. 6A simultaneously, a micro device 10f of the present embodiment is similar to the micro device 10a, and the difference between the two is that the micro device 10f of the present embodiment further includes a light guide layer 140 disposed on a portion of the light-transmissive layer 130a, wherein the light-transmissive layer 130a is located between the light guide layer 140 and the top surface 102 of the epitaxial structure 100. Herein, the material of the light guide layer 140 is, for example, silicon dioxide, silicon nitride, or other materials having a refractive index less than that of the epitaxial structure 100. Herein, the light guide layer 140 and the light-transmissive layer 130a may be different materials. More preferably, the material refractive index of the light guide layer 140 may be less than the refractive index of the light-transmissive layer 130a, which may prevent total light reflection of light emission of the light-emitting layer to increase optical efficiency.

Referring to FIG. 6A and FIG. 6B simultaneously, in detail, the light guide layer 140 of the present embodiment does not completely cover the top surface 132a of the light-transmissive layer 130a. In a preferred embodiment, the ratio of the area of the orthographic projection of the light guide layer 140 on the top surface 102 to the area of the orthographic projection of the light-transmissive layer 130a on the top surface 102 is greater than or equal to 0.8 and less than or equal to 1, which may increase the optical efficiency of the micro device 10f. In another preferred embodiment, the width of the orthographic projection of the light guide layer 140 on a plane P is greater than the width of the orthographic projection of the epitaxial structure 100 on the plane P, which may effectively improve the optical efficiency of the micro device 10f. In another preferred embodiment, the orthographic projection of the light guide layer 140 on the plane P completely covers the orthographic projection of the epitaxial structure 100 on the plane P, and since the area of the light guide layer 140 and the area of the light-transmissive layer 130a are both greater than the area of the top surface 102, the optical efficiency of the micro device 10f may be effectively increased.

Based on the above, in the design of the micro device of the invention, the light-transmissive layer covers the top surface of the epitaxial structure and is extended over a portion of the peripheral surface exposed by the insulating layer. That is, the area of the light-transmissive layer is greater than the area of the top surface of the epitaxial structure. The micro device of the invention may have better optical efficiency compared to the prior art in which the area of the light-transmissive layer is less than the area of the top surface of the epitaxial structure.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A micro device, comprising:
   an epitaxial structure having a top surface and a bottom surface opposite to each other and a peripheral surface connected to the top surface and the bottom surface, wherein a first-type semiconductor layer, a light-emitting layer and a second-type semiconductor layer are sequentially stacked from the top surface of the epitaxial structure toward the bottom surface of the epitaxial structure to form the epitaxial structure;
   an insulating layer covering the peripheral surface and the bottom surface of the epitaxial structure and exposing a portion of the peripheral surface; and
   a light-transmissive layer covering and directly contacting the top surface of the epitaxial structure and extended over and directly contacting at least a portion of the portion of the peripheral surface,
   wherein a ratio of a first vertical height of the light-transmissive layer from the top surface to the peripheral surface to a second vertical height of the epitaxial structure is greater than or equal to 0.05 and less than or equal to 0.25,
   wherein the insulating layer is not in contact with the light-transmissive layer and there is a vertical air spacing between the insulating layer and the light-transmissive layer, and the vertical air spacing is less than or equal to 0.5 μm and greater than 0 μm.

2. The micro device of claim 1, wherein a material of the insulating layer is the same as a material of the light-transmissive layer.

3. The micro device of claim 1, wherein a first thickness of the insulating layer on the peripheral surface is equal to a second thickness of the light-transmissive layer on the peripheral surface.

4. The micro device of claim 1, wherein a first thickness of the insulating layer on the peripheral surface is less than a second thickness of the light-transmissive layer on the peripheral surface.

5. The micro device of claim 4, wherein a ratio of the first thickness of the insulating layer to the second thickness of the light-transmissive layer is greater than or equal to 0.8.

6. The micro device of claim 1, wherein a first thickness of the insulating layer on the peripheral surface is greater than a second thickness of the light-transmissive layer on the peripheral surface.

7. The micro device of claim 6, wherein a ratio of the first thickness of the insulating layer to the second thickness of the light-transmissive layer is less than or equal to 8.

8. The micro device of claim 1, wherein the first vertical height is greater than or equal to 0.5 μm and less than or equal to 1 μm.

9. The micro device of claim 1, wherein a root mean square roughness of a contact surface of the light-transmissive layer and the top surface of the epitaxial structure is greater than a light-emitting surface of the light-transmissive layer.

10. The micro device of claim 1, further comprising:
    a light guide layer disposed on a portion of the light-transmissive layer, wherein the light-transmissive layer is located between the light guide layer and the top surface of the epitaxial structure.

11. The micro device of claim 10, wherein a ratio of an area of an orthographic projection of the light guide layer on the top surface to an area of an orthographic projection of the light-transmissive layer on the top surface is greater than or equal to 0.8 and less than or equal to 1.

12. The micro device of claim 10, wherein a width of an orthographic projection of the light guide layer on a plane is greater than a width of an orthographic projection of the epitaxial structure on the plane.

13. The micro device of claim 12, wherein the orthographic projection of the light guide layer on the plane covers the orthographic projection of the epitaxial structure on the plane.

* * * * *